United States Patent [19]

Takagi et al.

[11] Patent Number: 5,077,266

[45] Date of Patent: Dec. 31, 1991

[54] METHOD OF FORMING WEAK-LINK JOSEPHSON JUNCTION, AND SUPERCONDUCTING DEVICE EMPLOYING THE JUNCTION

[75] Inventors: Kazumasa Takagi, Tokyo; Tokuumi Fukazawa, Tachikawa; Yoshimi Kawanami, Fuchu; Yuuichi Madokoro, Kokubunji; Katsuki Miyauchi, Hino; Toshiyuki Aida, Chofu; Yukio Honda, Fuchu; Masaaki Futamoto, Kanagawa; Masahiko Hiratani, Akishima, all of Japan

[73] Assignee: Hitachi, Ltd., Tokyo, Japan

[21] Appl. No.: 405,737

[22] Filed: Sep. 11, 1989

[30] Foreign Application Priority Data

Sep. 14, 1988 [JP] Japan ............................ 63-228686
Sep. 14, 1988 [JP] Japan ............................ 63-228687
Oct. 19, 1988 [JP] Japan ............................ 63-261492

[51] Int. Cl.[5] .............................................. B32B 9/00
[52] U.S. Cl. ................................... 505/1; 565/701;
565/702; 565/729; 427/62; 427/63; 156/600;
156/603; 156/610; 156/611; 156/612; 156/613
[58] Field of Search ............... 156/600, 603, 610, 611,
156/612, 613, 614; 505/1, 701, 702, 729;
427/62, 63

[56] References Cited

U.S. PATENT DOCUMENTS 4,316,785  2/1982  Suzuki et al. ...................... 505/817
4,366,494 12/1982  Ohta ................................... 505/874
4,940,693  7/1990  Shappirio et al. ................. 505/702
4,962,316 10/1990  Jack ................................... 505/849

FOREIGN PATENT DOCUMENTS 0325765  8/1989  European Pat. Off. .
0329603  8/1989  European Pat. Off. .
1-182949  7/1989  Japan ................................. 505/702
1-202876  8/1989  Japan ................................. 505/702

OTHER PUBLICATIONS

Tsai et al., "All-Ceramics Josephson Junctions Operative up to 90° K.", Japanese Journal of Applied Physics, vol. 26, No. 5, May 1987, pp. L701-L703.
Liou et al, "Tunneling Characteristics of Internal Josephson Junctions in $YBaCuO_{7-\delta}$ Thin Films", Brief Reports, The American Physical Society, No. 38, pp. 11805-11808.
Yamashita et al, "Josephson Effects at 77° K., in Grain Boundary Bridge made of Thick Films", Japanese Journal of Applied Physics, vol. 27, Jun. 1988, pp. L1107-L1109.
Chaudhari et al., "Quantum Interference Devices made From Superconducting Oxide Thin Films", Appl. Phys. Lett., 51(3), 20, Jul. 1987, pp. 200-202.

*Primary Examiner*—Robert Kunemund
*Attorney, Agent, or Firm*—Kenyon & Kenyon

[57] ABSTRACT

A weak-link Josephson junction is of the type employing a thin film of an oxide superconductor, in which a crystal grain boundary produced reflecting an artificial crystal defect is utilized as the weak-link junction. The crystal grain boundary is formed concretely by a method in which atoms of different species are deposited on the predetermined part of the surface of a substrate, the predetermined part of the surface of a substrate is disturbed, or parts of different crystal face orientations are formed at the surface of a substrate, whereupon the superconducting thin film is epitaxially grown on the substrate, or by a method in which the predetermined part of the superconducting thin film, epitaxially grown on a substrate, is diffused with atoms of different species hampering a superconductivity, or the predetermined part of the superconducting thin film is disturbed, whereupon the superconducting thin film is annealed.

16 Claims, 6 Drawing Sheets

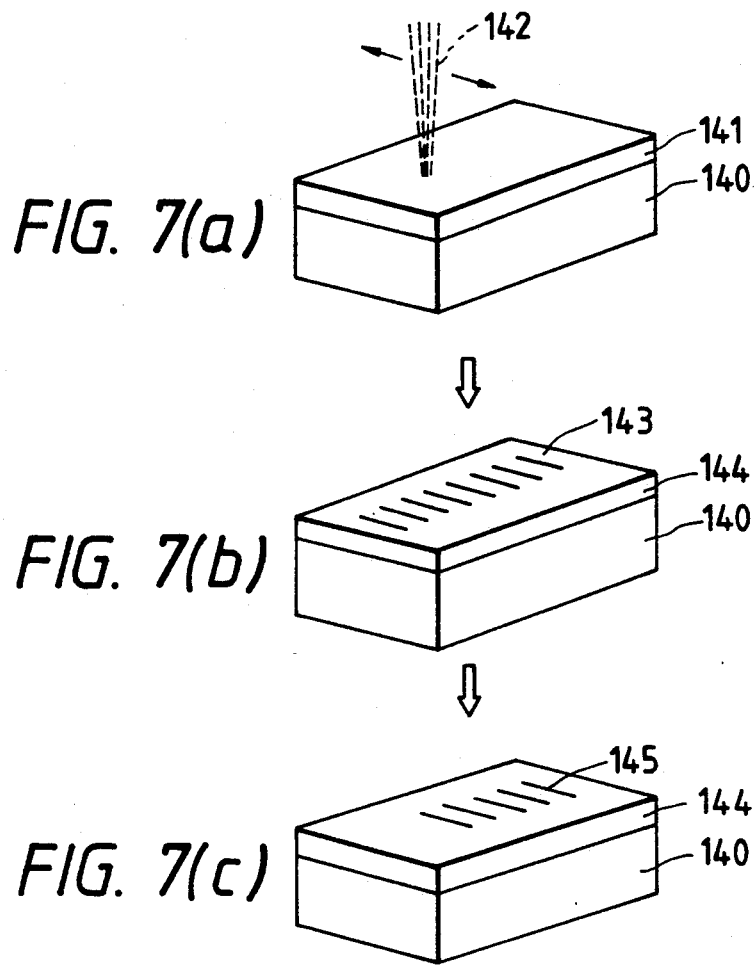
FIG. 7(a)
FIG. 7(b)
FIG. 7(c)
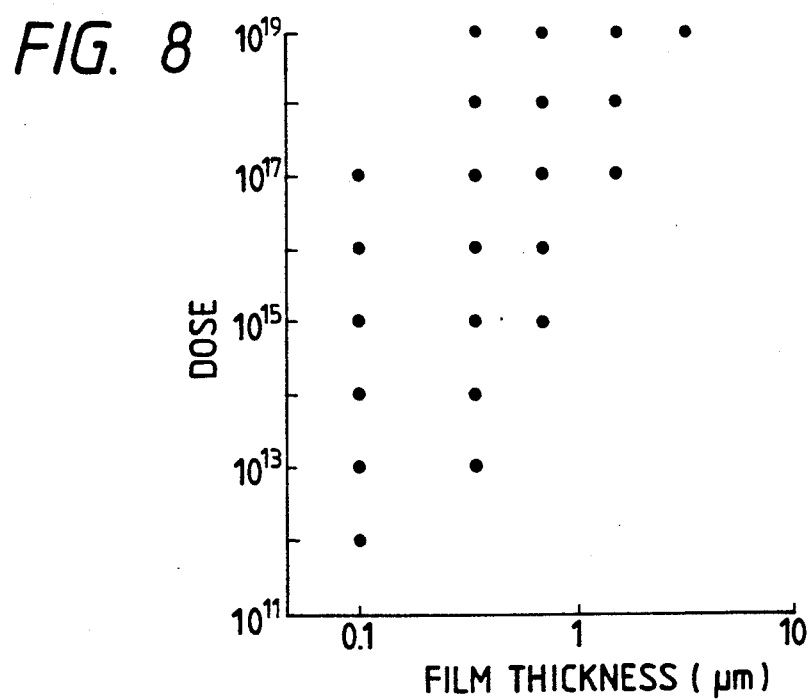
FIG. 8

METHOD OF FORMING WEAK-LINK JOSEPHSON JUNCTION, AND SUPERCONDUCTING DEVICE EMPLOYING THE JUNCTION

BACKGROUND OF THE INVENTION

The present invention relates to a method of forming a Josephson junction, particularly a weak-link junction, of oxide superconductor, and also to a superconducting device employing such a junction.

Owing to the advent of oxide superconductors, the critical temperatures (Tc) of which exceed the boiling point of liquid nitrogen (77 K), new superconducting devices are expected. However, when a device, especially an electronics device, is to be formed using an oxide superconductor, several problems are left unsolved. One of them is the formation of a Josephson junction. In a conventional Josephson junction device employing a metal superconductor, a tunnel junction in which a very thin insulating layer is interposed between thin superconductor films has been formed. The main reasons for the realization of this junction are that, in the case of the metal superconductor, an insulating film (of, for example, $SiO_2$) which does not react with the thin superconductor films and which exhibits an excellent insulation even with a very small thickness can be formed, and that the metal superconductor has a coherent length as great as several tens of Å. Superconducting switching devices, etc. have been developed by employing such tunnel junctions.

With the high-temperature oxide superconductor, however, (1) since the coherent length thereof is as small as several Å, the insulating layer must be made thinner than in the conventional case, and (2) in order to obtain thin superconductor films of high Tc, the films must be formed under the condition of a high substrate temperature or must be annealed at high temperatures. Furthermore, unlike the metal superconductors, the oxide superconductor is prone to react with insulating materials (in general, oxides). Therefore it is very difficult to form the tunneling type Josephson junction. For these reasons, Josephson junctions have heretofore been obtained only when a bar 10 of superconductor ceramics is pressed against the superconductor 11 as shown in FIG. 14, and a Josephson junction in the form of layered films has not been fabricated.

As one Josephson junction fabricated of a thin film, there has been known as a weak-link junction in which a superconducting link is weakened by thinning the film partly or by narrowing a portion for the flow of current.

A practicable method of forming the weak link is one wherein, as shown in FIG. 15, a substrate 20 is provided with a step 21, and the thickness of the thin superconducting film 22 formed thereon is changed. In an alternative method hydrogen ions are implanted, thereby causing the superconducting current to flow through only the narrow region. In another method wherein grain boundaries are utilized, and so forth. Examples of the method which utilizes the grain boundaries are described in Phys. Rev. Lett. 60 (1988) 1653 and the official gazette of Japanese Patent Application Laid-open No. 273782/1987. With these examples, however, it is expected that the grain boundaries of the polycrystalline superconducting thin-film will happen to come to a place where the junction is to be formed. Besides an inferior reproducibility, the examples have had the problem that the shape and position of the junction cannot be selected at will. Further, they have had the problem that, since a plurality of grain boundaries exist, a large number of junctions are formed in series in the direction of the current, resulting in an inferior I-V characteristic.

In the technique of Japanese Patent Application Laid-open No. 273782/1987, epitaxial growth is applied for the purpose of reproducibly forming weak-link Josephson junctions of uniform characteristics at a predetermined position. According to the prior-art technique, a slit-like pattern is formed on a single-crystal substrate, and a thin superconducting film is epitaxially grown thereon. The thin superconducting film on the slit-like pattern is hindered in the epitaxial growth, to become polycrystalline at the beginning. The thickness of the film increases later, with the result that a single grain boundary is formed on the slit-like pattern. With the prior-art method, however, a photoresist process is required for forming the pattern, so that the contamination of the surface of the substrate, which is a factor for hampering the epitaxial growth, is liable to occur and degrades the reproducibility. Another problem has been that, since the pattern has its minimum width limited by microfabrication technology, it is difficult to produce a thin superconductive film.

SUMMARY OF THE INVENTION

According to the prior-art method of forming a weak-link Josephson junction by the use of a thin film of oxide superconductor, it is difficult to form weak-link Josephson junctions of uniform characteristics at a predetermined position, and it has been problematic in terms of reliability. The present invention reproducibly form weak-link Josephson junctions of uniform characteristics at a predetermined position. The present invention also fabricates a superconducting device by the use of the weak-link Josephson junction thus formed.

The present invention utilizes a crystal grain boundary, which is produced reflecting an artificial crystalline defect, as the weak-link Josephson junction. Concretely, first, atoms of different species from a superconducting material are deposited on a substrate, or the surface of a substrate is disturbed. Subsequently, a thin film is epitaxially grown on the substrate. An ion beam which is accelerated and focused is used as means for the deposition or destruction.

The concrete operation of this expedient will be described in conjunction with FIGS. 1(a)-1(c). When the surface of a substrate 30 is irradiated with a focused ion beam of Ga or the like 31, the metal is deposited or a damaged layer 32 is formed down to a depth of about 100-200 Å below the surface of the substrate 30, in accordance with the magnitude of the acceleration voltage of the ion beam 31 (FIG. 1(a)). The width of the deposited region or damaged region can be changed by the way of focusing the ion beam 31, and can be made 1 μm or less. In addition, the thickness of the deposited matter is determined by an ion dose and a beam width. When the beam 31 having a diameter of 1 μm is projected at a dose of $10^{16}/cm^2$, the deposited matter comes to have a thickness of 39 Å. A superconducting thin film 33 is then formed on substrate 30 under the condition of epitaxial growth. On regions not subjected to the deposition or damages, the superconducting thin film 33 is epitaxially grown, whereas on the region 34 processed by the ion beam 31, the epitaxial growth is hindered, and microcrystals 35 are produced (FIG.

1(b)). When the film 33 thickens, crystals which have grown from both the sides of the region 34 processed by the ion beam 31 collide against each other. Although the crystals on both the sides have the same crystal orientation, they involve a slight shift. Therefore, a crystal grain boundary 36 having almost no misfit is produced between the two crystals (FIG. 1(c)). Owing to the crystal grain boundary 36, the phase between both the sides of the grain boundary is held, a superconducting current across both the sides becomes low, and a weak link permitting the intrusion of a magnetic flux is formed.

Another expedient is as follows: A superconducting thin film epitaxially grown on a substrate is diffused with atoms of different species which hinders a superconducting current from flowing, or it has the vicinity of its surface disturbed, and the resultant superconducting thin film is annealed, thereby to form a crystal grain boundary. An ion beam which is accelerated and focused is used as means for the diffusion or damaging.

The concrete operation of this expedient will be described in conjunction with FIGS. 2(a) and 2(b). When a superconducting thin film 131, epitaxially grown on a substrate 130 is irradiated with a focused ion beam of Ga or the like 132, the metal is deposited or a diffused region 133 is formed down to a depth of about 100–200 Å below the front or top surface of the superconducting thin film 131, in accordance with the magnitude of the acceleration voltage of the ion beam 132 (FIG. 2(a)). When the superconducting thin film 134 thus processed is annealed, recrystallization occurs to produce a crystal grain boundary 135 in the region subjected to the deposition or damaging (FIG. 2(b)). Since crystals on both the sides of the crystal grain boundary 135 have the same crystal orientation, almost no misfit is involved between the crystal grains of both the sides.

Still another expedient is as follows: A part of different crystal plane orientation is artificially formed on a substrate, and superconducting thin films of different growth orientations are epitaxially grown on the substrate, whereby a crystal grain boundary which hinders a superconducting current from flowing is formed on the part of the substrate at which the crystal face orientations thereof have been changed.

Oxide superconductor materials formulated by $Ln_1Ba_2Cu_3O_y$ (where Ln denotes a rare-earth metal such as Y, Er or Ho) have an orthorhombic perovskite structure, the a-axis, b-axis and c-axis of which have lengths of 3.83 Å, 3.89 Å and 11.7 Å, respectively. To enhance the characteristics of the critical temperature (Tc), the critical current density (Jc), etc. of any of these oxide-superconductor materials of thin films, it is important to select the composition of the thin films and an appropriate substrate material. In particular, since the oxide-superconductor thin-film material undergoes a high temperature process of 600° C.–950° C. in a film forming process, a material having a low reactivity with the thin films needs to be selected as the substrate material. Further, for forming thin film crystals of favorable superconductivity properties, a substrate having few crystal grain boundaries and facilitating epitaxial growth needs to be selected. The substrate materials which are desirable from these viewpoints are strontium titanate ($SrTiO_3$), magnesium oxide (MgO), zirconium dioxide ($ZrO_2$), etc.

It has been revealed that, in cases where the thin films of the oxide superconductors are formed by vapor deposition or sputtering, the growth directions of thin film crystals differ depending upon the kinds of substrate materials and the crystal plane orientations of substrates. By way of example, in a case where the thin film of the oxide superconductor is formed on the substrate of MgO (100) or $ZrO_2$ (100), the lattice constants of the substrate and the a- and b-axes of the thin film mismatch greatly, and hence, the film whose c-plane, most stable in term of energy, lies in contact with the plane of the substrate, is formed.

In contrast, in a case where the thin film of the oxide superconductor is formed on a substrate of $SrTiO_3$ (100), the lattice constant (3.90 Å) of $SrTiO_3$ is substantially equal to the lattice constant of the b-axis or the length of ⅓ of c-axis of the oxide-superconductor thin film, and hence, the oxide-superconductor thin film is epitaxially grown on the substrate into an a-axis oriented one. Likewise, on a substrate of $SrTiO_3$ (110), an oxide-superconductor thin film oriented in the direction (110) is formed.

Further, it has been revealed that, when a crystal plane of substrate, for example, $SrTiO_3$ (100), $SrTiO_3$ 110) or $SrTiO_3$ (111) is set a slight angle $\theta$ off as shown in FIG. 3, the crystal orientation of the thin film of the oxide superconductor to be formed on the substrate can be controlled. By way of example, it has been found out that, when an oxide-superconductor thin film is formed under the same conditions on a region 231 in which the surface of the $SrTiO_3$ (100) substrate 230 is exactly conformed to the (100) plane and a region 232 in which the front surface is set or shifted off the angle $\theta$ from the (100) plane, it is produced into an a-axis oriented on the region 231 exactly conformed to the (100) plane, whereas it is produced into a c-axis oriented on the region 232 set off the angle $\theta$. In this case, the crystal orientations of the thin films differ at the boundary part of the substrate 230 at which the crystal plane orientation thereof inclines slightly, so that a crystal grain boundary 233 is formed.

Herein, the off angle $\theta$ should desirably be 0.5 degree or more. Similar effects are attained even when $SrTiO_3$ (110), $SrTiO_3$ (111), MgO and $ZrO_2$ substrates are employed.

BRIEF DESCRIPTION OF THE DRAWINGS

FIGS. 7(a)–7(c) are views showing the manufacturing process of each of Examples 11–19 in the present invention.

FIG. 8 is a graph showing the relationship between a dose and a film thickness for fabricating a weak-link Josephson junction as has been obtained from Examples 11–15.

DETAILED DESCRIPTION

Now, the present invention will be described in detail in conjunction with the following examples.

in Table 1, critical current densities across the grain boundaries 45 in the case of the film having the thickness of 0.7 μm lowered in a range from 50% to 3%. When currents were caused to flow in the direction [001], the absolute values of the currents decreased by about half, but the influences of the grain boundaries 45 tended to be identical. In spite of the irradiation with the ions, the critical current density of each place where the grain boundary 45 was not observed had almost no difference from that of the region not irradiated. When the temperature dependency of the critical current density (Jc) was investigated, a relation of Jc $\propto \{1-(T/Tc)\}^{1.6}$ was found. In addition, when the variation of a critical current versus a magnetic field was investigated, the cyclic dependency of the superconducting current upon the magnetic field was observed, and the fabrication of weak-link Josephson junctions was verified.

TABLE 1

| Film thickness (μm) | Dose (cm$^{-2}$) | | | | | | | | Jc/Jco (%) |
| --- | --- | --- | --- | --- | --- | --- | --- | --- | --- |
| | 0 | 5 × 10$^{11}$ | 5 × 10$^{12}$ | 5 × 10$^{13}$ | 5 × 10$^{14}$ | 5 × 10$^{15}$ | 5 × 10$^{16}$ | 5 × 10$^{17}$ | 5 × 10$^{18}$ |
| 0.70 | 100 | 100 | 100 | 100 | 50 | 32 | 18 | 9 | 3 |
| 0.35 | 100 | 100 | 50 | 35 | 26 | 21 | 16 | 5 | 1 |
| 0.10 | 100 | 75 | 42 | 29 | 22 | 17 | 8 | 2 | 0 |
| 1.50 | 100 | 100 | 100 | 100 | 100 | 100 | 60 | 48 | 32 |
| 3.00 | 100 | 100 | 100 | 100 | 100 | 100 | 100 | 100 | 58 |

EXAMPLE 1

Figure 1A:
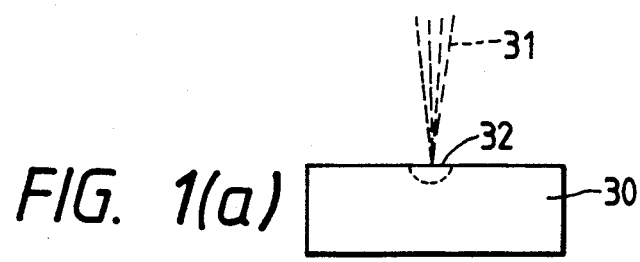
FIGS. 1(a)–1(c), FIGS. 2(a)–2(b), and FIG. 3 are views for explaining methods of forming a crystal grain boundary at a predetermined position, respectively.
Figure 1B:
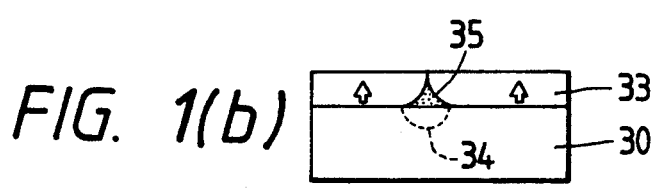
Figure 1C:
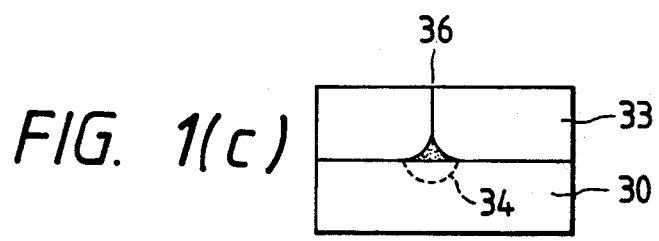
Figure 2A:
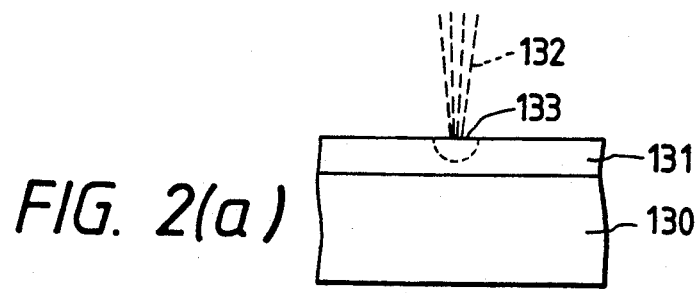
Figure 2B:
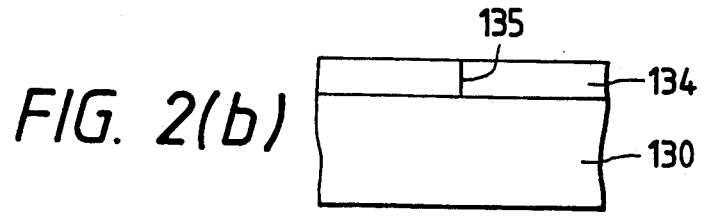
Figure 3:
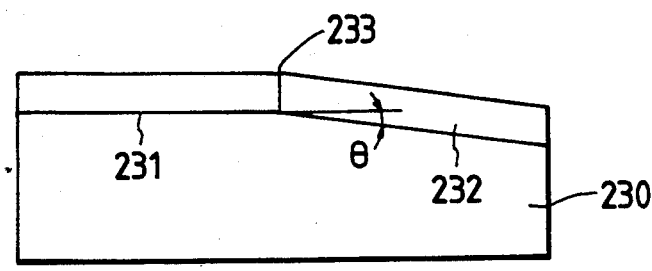
Figure 4A:
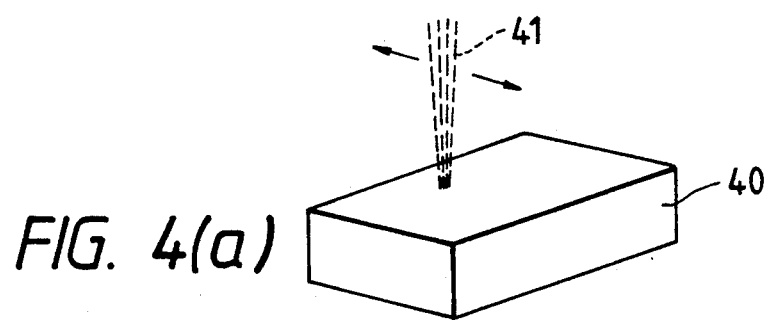
FIGS. 4(a)–4(c) are views showing the manufacturing process of each of Examples 1–9 of the present invention.
Figure 4B:
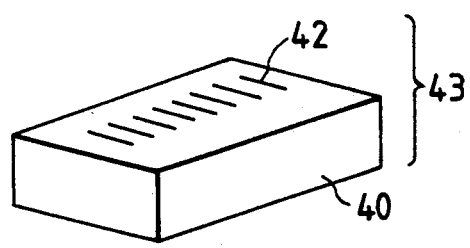
Figure 4C:
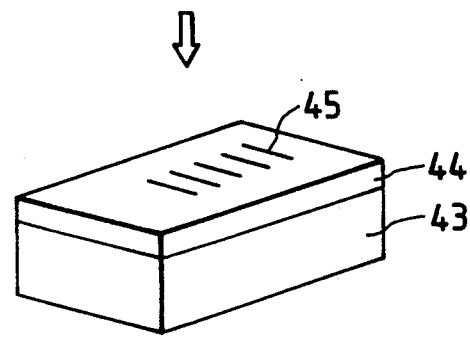

Example 1 of the present invention will be described with reference to FIGS. 4(a)-4(c).

On a single-crystal substrate 40 of strontium titanate (SrTiO$_3$) of plane orientation (110) which had no distortion and which was mirror-polished, gallium (Ga) 41 was irradiated in the form of lines in directions [011] and [0011] by a focused ion beam (FIB) method. The conditions of the projection were an acceleration voltage of 30 kV, a line width of 1 μm (measured by SIM: scanning ion microscopy), and a line length of 0.5 mm. The doses of the Ga were $5 \times 10^{11} - 5 \times 10^{18}$/cm$^2$, and were changed one order of magnitude in succession. The eight lines 42 of the respective doses were formed at intervals of 3 mm.

On the resultant substrate 43 subjected to the above processing, a thin film of ErBa$_2$Cu$_3$O$_{7-\delta}$ 44 was formed by sputtering. To achieve epitaxial growth, the temperature of the substrate 43 was held at 700° C. during the formation of the film 44. The thickness of the film 44 was 0.7 μm. In the film 44 formed by the sputtering, linear defects were noted in correspondence with the places irradiated with the Ga ions. Exactly, the linear defects were observed in correspondence with the five lines whose doses were $5 \times 10^{14}$/cm$^2$ or above. The film 44 was annealed in oxygen at 830° C. for 2 hours. The linear defects, namely, grain boundaries 45 became clear after the annealing.

To examine the superconducting properties of the grain boundary 45, the parts of the superconducting film 44 at both the ends of the grain boundary 45 were removed to form the neck portion of this superconducting film, and the I-V characteristic of the grain boundary 45 was measured by a conventional four-probe method. As illustrated by a typical example in FIG. 12, the I-V curve exhibited the feature of superconductivity. When current was caused to flow in a direction [110], a critical current density at 77° K. in a region having no grain boundary was $2 \times 10^4$ A/cm$^2$. As listed

EXAMPLE 2

Using a substrate which was irradiated with ions under the same conditions as in Example 1, a thin film of ErBa$_2$Cu$_3$O$_{7-\delta}$ was formed thereon by sputtering. Conditions for the film formation were the same as in Example 1 except for a film thickness of 3500 Å. In the film which was annealed in oxygen at 830° C. for 2 hours, grain boundaries were observed in correspondence with seven lines whose doses were $5 \times 10^{12}$/cm$^2$ or above. As in the case of Example 1, the I-V characteristics of the grain boundaries were investigated by the conventional four-probe method. The film of Example 1 had a critical temperature (Tc) as high as 88° K., but the temperature Tc of the film being 3500 Å thick lowered to 83° K. This is because the film was intensely influenced by the diffusion of the impurity from the substrate. A critical current density at 77° K. in a region having no grain boundary was $6 \times 10^4$ A/cm$^2$. As listed in Table 1, critical current densities in the places of the grain boundaries lowered from 50% to 1%. In spite of the irradiation with the ions, the critical current density of the place where the grain boundary 45 was not observed had almost no difference from that of the non-irradiated region, as in Example 1. The reason why the critical current densities (Jc) were low at the grain boundaries whose ion doses were $5 \times 10^{16}$/cm$^2$ or above, is that these grain boundaries broadened because the film was thin. When the temperature dependency was investigated, the relation of Jc $\propto \{1-(T/Tc)\}^{1.6}$ was noted at the grain boundaries whose ion doses were $5 \times 10^{15}$/cm$^2$ or below. In addition, when the variation of the critical current versus the magnetic field was investigated, a cyclic curve was observed, and the fabrication of weak-link Josephson junctions was verified.

EXAMPLE 3

As in Examples 1 and 2, a thin film of ErBa$_2$Cu$_3$O$_{7-\delta}$ was formed to a thickness of 1000 Å on a substrate irradiated with ions and was annealed in oxygen. The critical temperature (Tc) of the film was 80° K. After the annealing, grain boundaries were observed in places corresponding to all lines. A critical current density at 77° K. in a region having no grain boundary was $2 \times 10^3$ A/cm$^2$, while critical current densities across the grain boundaries lowered in a range from 75% to 0% as listed in Table 1.

EXAMPLE 4

As in Example 1, a thin film of ErBa$_2$Cu$_3$O$_{7-\delta}$ was formed to a thickness of 1.5 μm on a substrate irradiated with ions and was annealed in oxygen. The critical temperature (Tc) of the film was 85° K. After the annealing, grain boundaries were observed in places corresponding to lines whose doses were $5 \times 10^{16}$/cm$^2 - 5 \times 10^{18}$/cm$^2$. A critical current density at 77° K. in a region having no grain boundary was $3 \times 10^4$ A/cm$^2$, while critical current densities in the places of the grain boundaries lowered in a range from 60% to 32% as listed in Table 1.

EXAMPLE 5

The thickness of a thin film of ErBa$_2$Cu$_3$O$_{7-\delta}$ to be formed was set at 3 μm. In this case, a grain boundary was observed in only a place corresponding to a line which was irradiated at a dose of $5 \times 10^{18}$/cm$^2$. It was found that only the corresponding part could be utilized as a weak-link Josephson junction.

Figure 5:
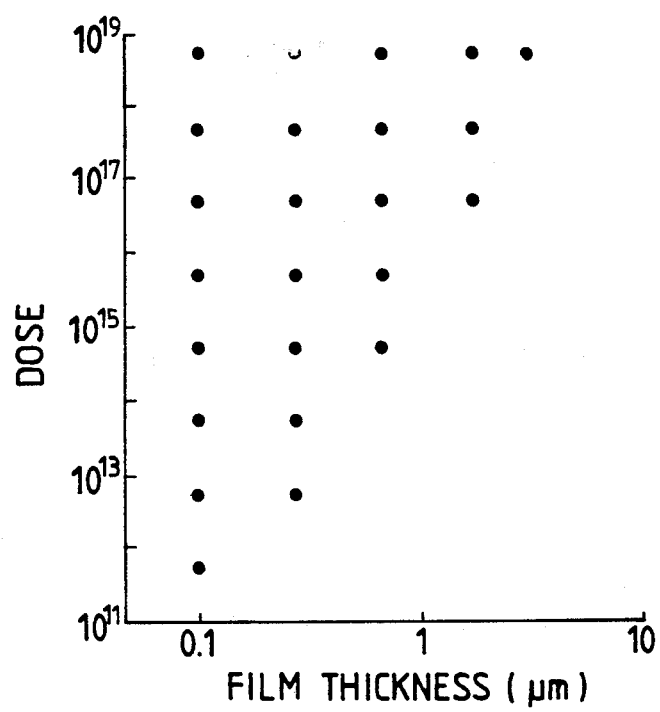
FIG. 5 is a graph showing the relationship between a dose and a film thickness for fabricating a weak-link Josephson junction as has been obtained from Examples 1–5.

When the results of the above examples 1-5 are summed up in the relationship between the film thickness and the irradiation dose, it has been revealed that a domain indicated by black dots in FIG. 5 is appropriate.

EXAMPLE 6

Titanium was used as the ion source of an FIB to be irradiated, titanium (Ti) being the constituent element of a strontium titanate (SrTiO$_3$) substrate. The SrTiO$_3$ (110) substrate was irradiated with the Ti in the form of lines under the same conditions as in Example 1. A thin film of ErBa$_2$Cu$_3$O$_{7-\delta}$ which was 0.7 μm thick as in Example 1 was formed on the resultant substrate. Even when the ion source was altered from the Ga to the Ti, no difference was noted as to the appearance of grain boundaries. It was also found that the I-V characteristic and the value of Jc exhibited very high reproducibilities.

EXAMPLE 7

In the irradiation of Ga ions, the acceleration voltage thereof was lowered from 30 kV to 15 kV. Under the same conditions as in Example 1 except for the acceleration voltage, an SrTiO$_3$ (110) substrate was irradiated with the Ga ions in the form of lines. A thin film of ErBa$_2$Cu$_3$O$_{7-\delta}$ having a thickness of 0.35 μm was formed on the resultant substrate by sputtering. Grain boundaries after the annealing of the thin film were observed in places corresponding to the lines whose doses were $5 \times 10^{14}$/cm$^2$ or above. The reason why the irradiation was less effective for the formation of the grain boundaries than in the case of the acceleration voltage of 30 kV, will be that the substrate was damaged to a lesser degree, to approximate the situation of the vapor deposition of Ga.

EXAMPLE 8

SrTiO$_3$ (100) was employed for a substrate, which was irradiated with Ga ions in the form of lines under the same conditions as in Example 1. A thin film of YBa$_2$Cu$_3$O$_{7-\delta}$ having a thickness of 0.7 μm was formed on the substrate subjected to the ion beam processing. The thin film was grown so that the a-axis [100] thereof might become perpendicular to the plane of the film. Although the c-axis and b-axis of the film mixed within the plane thereof, grain boundaries were clearly observed in correspondence with the linear parts irradiated with the Ga and formed under the same conditions of doses as in Example 1. This indicated that the grain boundaries were hardly affected by the orientation of the substrate and the material of the superconducting thin film.

EXAMPLE 9

Magnesium oxide (MgO) (100) was used for a substrate, which was irradiated with Ti ions at an acceleration voltage of 30 kV and at doses of $5 \times 10^{11}$/cm$^2 - 5 \times 10^{18}$/cm$^2$ as in Example 6. A thin film of YBa$_2$Cu$_3$O$_{7-\delta}$ having a thickness of 0.35 μm was formed on the resultant substrate. The thin film was such that the c-axis thereof became perpendicular to the plane of the substrate, and that the a-axis and b-axis thereof could not be distinguished. However, grain boundaries appeared in places corresponding to lines whose doses were $5 \times 10^{12} - 5 \times 10^{18}$/cm$^2$. The value of Jc in a region where no grain boundary was formed, was substantially related to the film thickness and the dose irrespective of the kind of the substrate.

EXAMPLE 10

Figure 6:
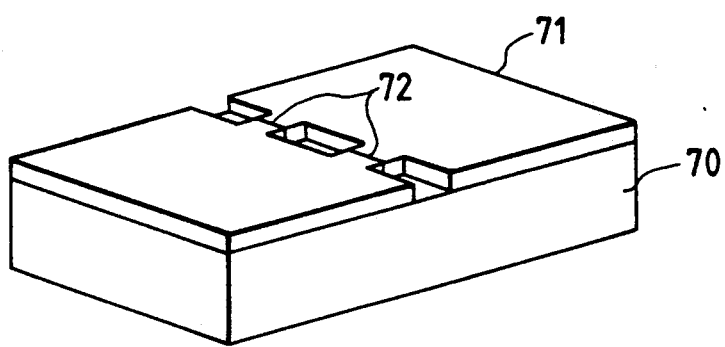
FIG. 6 is a view showing the structure of a SQUID (superconducting quantum interference device) fabricated by Example 10 of the present invention.

The crystal grain boundaries formed by the method indicated by the above examples 1-9 were utilized for the weak-link Josephson junctions, and a dcSQUID (direct-current superconducting quantum interference device) was fabricated. An SrTiO$_3$ (110) substrate 70 was irradiated with Ga ions in the form of two serial lines having a line width of 1 μm, a length of 0.5 mm and an interval of 0.8 mm, under the conditions of an acceleration voltage of 30 kV and a dose of $5 \times 10^{15}$/cm$^2$. An ErBa$_2$Cu$_3$O$_{7-\delta}$ thin film 71 having a thickness of 0.35 μm was formed on the resultant substrate under the same conditions as in Example 1. The thin film thus formed was processed by photolithography and chemical etching into the pattern of the SQUID which utilized two grain boundaries 72 as shown in FIG. 6.

Figure 13:
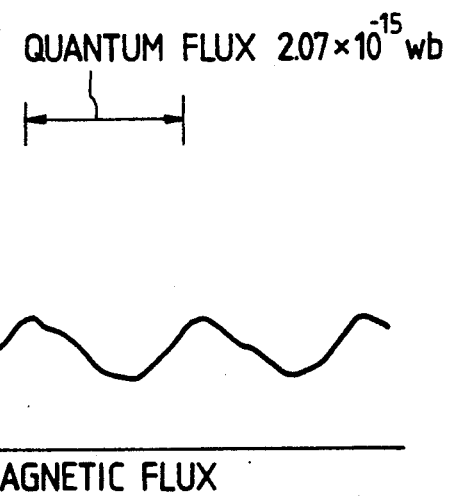
FIG. 13 is a graph showing the variation of a voltage corresponding to a quantum flux as measured by the SQUID.
Figure 14:
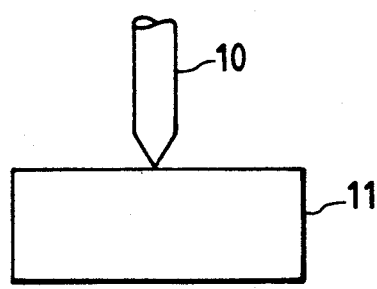
FIG. 14 is a sectional view of a tunneling type Josephson junction.
Figure 15:
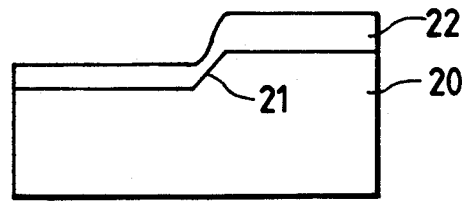
FIG. 15 is a sectional view of a prior-art example of a weak-link Josephson junction formed by a thin film.

A magnetic flux was measured at 76° K. by causing a bias current to flow through the SQUID. As a result, a voltage corresponding to a quantum flux was observed as shown in FIG. 13. It has accordingly been indicated that the weak-link junctions which utilize the grain boundaries formed by the present invention are applicable to superconductor devices.

EXAMPLE 11

Example 11 of the present invention will be described with reference to FIGS. 7(a)-7(c).

On a single-crystal substrate 140 of strontium titanate (SrTiO$_3$) of plane orientation (110) which had no distortion and which was mirror-polished, a thin film of ErBa$_2$Cu$_3$O$_{7-\delta}$ 141 was formed by sputtering. To effect epitaxial growth, the temperature of the substrate 140 was held at 700° C. during the formation of the film 141. The thickness of the film 141 was 0.7 μm. A focused ion beam (FIB) of gallium (Ga) 142 was projected in the form of lines in directions [011] and [001] on the thin film 141. The conditions of the irradiation were an acceleration voltage of 30 kV, a line width of 1 μm (measured by SIM: scanning ion microscopy), and a line length of 0.5 mm. The doses of the Ga were $1\times10^{12}-1\times10^{19}/cm^2$, and were changed one order of magnitude in succession. The eight lines 143 of the respective doses were formed at intervals of 3 mm.

The resultant thin film 144 subjected to the processing was annealed in oxygen at 830° C. for 2 hours. After the annealing, the grain boundaries of defects appeared in the places bombarded with the ions. Exactly, the linear defects were observed in the five lines whose doses were $1\times10^{15}/cm^2$ or above. The linear defects, namely, grain boundaries 145 of the film 144 became clear.

To examine the superconducting properties of the grain boundary 145, the parts of the superconducting film 144 at both the ends of the grain boundary 145 were removed to form the neck portion of this superconducting film, and the I–V characteristic of the grain boundary 145 was measured by the conventional four-probe method. As illustrated by a typical example in FIG. 12, the I–V curve exhibited the feature of a superconductivity. A critical current density in a direction [110], at 77° K. in a region having no grain boundary was $2\times10^5$ A/cm². As listed in Table 2, critical current densities across the grain boundaries 145 in the case of the film thickness of 0.7 μm lowered in a range from 52% to 11%. The absolute values of the currents in the direction [001] decreased by about half, but the influences of the grain boundaries 145 tended to be identical. In spite of the irradiation with the ions, the critical current density of each place where the grain boundary 145 was not observed had almost no difference from that of the region not irradiated. When the temperature dependency of the critical current density (Jc) was investigated, the relation of $Jc \propto \{1-(T/Tc)\}^{1.6}$ was found. In addition, when the variation of a critical current versus a magnetic field was investigated, the cyclic dependency of the superconducting current upon the magnetic field was observed, and the fabrication of weak-link Josephson junctions was verified.

current density at 77° K. in a region having no grain boundary was $6\times10^4$ A/cm². As listed in Table 2, critical current densities in the places of the grain boundaries lowered in a range from 50% to 1%. In spite of the irradiation with the ions, the critical current density of the place where the grain boundary 145 was not observed had almost no difference from that of the non-irradiated region, as in Example 11. The reason why the critical current densities (Jc) were low at the grain boundaries whose ion doses were $1\times10^{17}/cm^2$ or above, is that these grain boundaries broadened because the film was thin. When the temperature dependency was investigated, the relation of $Jc \propto \{1-(T/Tc)\}^{1.6}$ was noted at the grain boundaries whose ion doses were $1\times10^{16}/cm^2$ or below. In addition, when the variation of the critical current versus the magnetic field was investigated, a cyclic curve was observed, and the fabrication of weak-link Josephson junctions was verified.

EXAMPLE 13

As in Example 11, a thin film of $ErBa_2Cu_3O_{7-\delta}$ was formed to a thickness of 1000 Å, and it was irradiated with ions and then annealed in oxygen. The critical temperature (Tc) of the film was 80° K. After the annealing, grain boundaries were observed in the places of all lines. A critical current density at 77° K. in a region having no grain boundary was $2\times10^3$ A/cm², while critical current densities across the grain boundaries lowered in a range from 39% to 0% as listed in Table 2.

EXAMPLE 14

A thin film of $ErBa_2Cu_3O_{7-\delta}$ with 1.5 μm thick was formed on a substrate, and it was irradiated with ions and then annealed in oxygen as in Example 11. The critical temperature (Tc) of the film was 85° K. After the annealing, grain boundaries were observed in places corresponding to lines whose doses were $1\times10^{17}/cm^2-1\times10^{19}/cm^2$. A critical current density at 77° K. in a region having no grain boundary was $3\times10^5$ A/cm², while critical current densities across the grain boundaries lowered in a range from 64% to 35%.

TABLE 2

| Film thickness (μm) | Dose (cm⁻²) | | | | | | | | Jc/Jco |
|---|---|---|---|---|---|---|---|---|---|
| | 0 | $1\times10^{12}$ | $1\times10^{13}$ | $1\times10^{14}$ | $1\times10^{15}$ | $1\times10^{16}$ | $1\times10^{17}$ | $1\times10^{18}$ | |
| 0.70 | 100 | 100 | 100 | 100 | 52 | 42 | 26 | 10 | |
| 0.35 | 100 | 100 | 50 | 39 | 26 | 20 | 14 | 3 | |
| 0.10 | 100 | 39 | 27 | 12 | 10 | 7 | 4 | 0 | |
| 1.50 | 100 | 100 | 100 | 100 | 100 | 100 | 64 | 42 | |
| 3.00 | 100 | 100 | 100 | 100 | 100 | 100 | 100 | 100 | |

EXAMPLE 12

A thin film of $ErBa_2Cu_3O_{7-\delta}$ having a thickness of 0.35 μm was formed by sputtering under the same conditions for the film formation as in Example 11, and was irradiated with ions under the same conditions as in Example 11. Thereafter, the thin film was annealed in oxygen at 830° C. for 2 hours. In the thin film, grain boundaries were observed in correspondence with seven lines whose doses were $1\times10^{13}/cm^2$ or above. As in the case of Example 11, the I–V characteristics of the grain boundaries were investigated by the conventional four-probe method. The film of Example 11 had as high a critical temperature (Tc) as 88° K., but the temperature Tc of the film being 0.35 μm thick lowered to 83° K. This is because the film was intensely influenced by the diffusion of the impurity from a substrate. A critical

EXAMPLE 15

The thickness of a thin film of $ErBa_2Cu_3O_{7-\delta}$ to be formed was set at 7 μm. In this case, a grain boundary was observed in only a place corresponding to a line which was irradiated at a dose of $1\times10^{19}/cm^2$. It was found that only the corresponding part could be utilized as a weak-link Josephson junction.

When the results of the above examples 11–15 are summed up in the relationship between the film thickness and the irradiation dose, it has been revealed that a domain indicated by black dots in FIG. 8 is appropriate.

EXAMPLE 16

Titanium was used as the ion source of an FIB to be irradiated, titanium (Ti) being the constituent element of a strontium titanate (SrTiO$_3$) substrate. A thin film of ErBa$_2$Cu$_3$O$_{7-\delta}$ having a thickness of 0.7 μm as in Example 11 was formed on the substrate, and was irradiated with the Ti in the form of lines under the same conditions as in Example 11. Even when the ion source was altered from Ga to Ti, no difference was noted as to the appearance of grain boundaries. It was also found that the I-V characteristic and the value of Jc exhibited very high reproducibilities.

EXAMPLE 17

In the irradiation of Ga ions, the acceleration voltage thereof was lowered from 30 kV to 15 kV. Under the same conditions as in Example 11 except for the acceleration voltage, an ErBa$_2$Cu$_3$O$_{7-\delta}$ thin film 0.35 μm thick formed on an SrTiO$_3$ (110) substrate was irradiated with the Ga ions in the form of lines. Grain boundaries after the annealing of the thin film were observed in places corresponding to the lines whose doses were $1 \times 10^{15}$/cm$^2$ or above. The reason why the irradiation was less effective for the formation of the grain boundaries than in the case of the acceleration voltage of 30 kV, will be that the thin film was damaged at a lower degree, to approximate the situation of the vapor deposition of Ga.

EXAMPLE 18

SrTiO$_3$ (100) was employed for a substrate, on which a thin film of YBa$_2$Cu$_3$O$_{7-\delta}$ having a thickness of 0.7 μm was formed. The thin film was irradiated with Ga ions in the form of lines under the same conditions as in Example 11. The thin film subjected to the ion beam processing had been grown so that the a-axis [100] thereof might become perpendicular to the plane thereof. Although the c-axis and b-axis of the film mixed within the plane thereof, grain boundaries were clearly observed in correspondence with the linear parts irradiated with the Ga and formed under the same conditions of doses as in Example 11. This indicated that the grain boundaries were hardly affected by the orientation of the substrate and the material of the superconducting thin film.

EXAMPLE 19

Magnesium oxide (MgO) (100) was used for a substrate, on which a thin film of YBa$_2$Cu$_3$O$_{7-\delta}$ having a thickness of 0.35 μm was formed. As in Example 16, the thin film was irradiated with Ti ions at an acceleration voltage of 30 kV and at doses of $1 \times 10^{12} - 1 \times 10^{19}$/cm$^2$. The thin film was such that the c-axis thereof became perpendicular to the plane of the substrate, and that the a-axis and b-axis thereof could not be distinguished. However, grain boundaries appeared in places corresponding to lines whose doses were $1 \times 10^{13} - 1 \times 10^{19}$/cm$^2$. The value of Jc in a region where no grain boundary was formed, was substantially related to the film thickness and the dose irrespective of the kind of the substrate.

EXAMPLE 20

Figure 9:
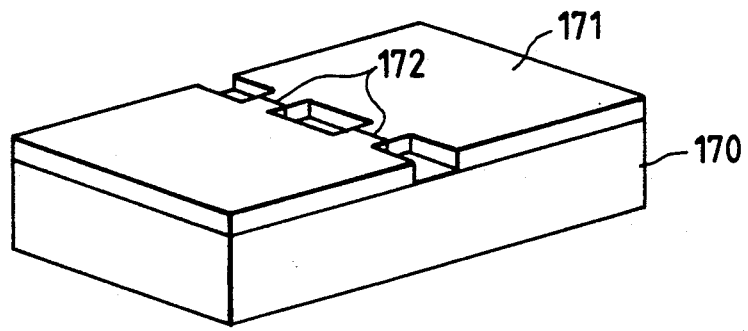
FIG. 9 is a view showing the structure of a SQUID fabricated by Example 20 of the present invention.

The crystal grain boundaries formed by the method indicated by the above examples 11-19 were utilized for the weak-link Josephson junctions, and a dcSQUID was fabricated. An SrTiO$_3$ (110) substrate 170 was overlaid with an ErBa$_2$Cu$_3$O$_{7-\delta}$ thin film 171 at a thickness of 0.35 μm under the same conditions as in Example 11. The thin film 171 was irradiated with Ga ions in the form of two serial lines having a line width of 1 μm, a length of 0.5 mm and an interval of 0.8 mm, under the conditions of an acceleration voltage of 30 kV and a dose of $5 \times 10^{15}$/cm$^2$. The thin film thus formed was processed by photolithography and chemical etching into the pattern of the SQUID which utilized two grain boundaries 172 as shown in FIG. 9.

A magnetic flux was measured at 76° K. by causing a bias current to flow through the SQUID. As a result, a voltage corresponding to a quantum flux was observed as shown in FIG. 13. It has accordingly been indicated that the weak-link junctions which utilize the grain boundaries formed by the present invention are applicable to superconductor devices.

According to Examples 1-20 of the present invention, a single crystal grain boundary can be formed at a predetermined position, and it can therefore be utilized for a superconducting weak-link Josephson junction. It is also of great merit that a bias current during the fabrication of a device can be controlled by selecting the thickness of a film and the level of a dose.

Incidentally, the method of forming a thin film in the present invention has been sputtering or layered deposition. Needless to say, however, the thin film of oxide superconductor can also be formed by reactive evaporation. Other methods of forming a film are also applicable.

EXAMPLE 21

Figure 10A:
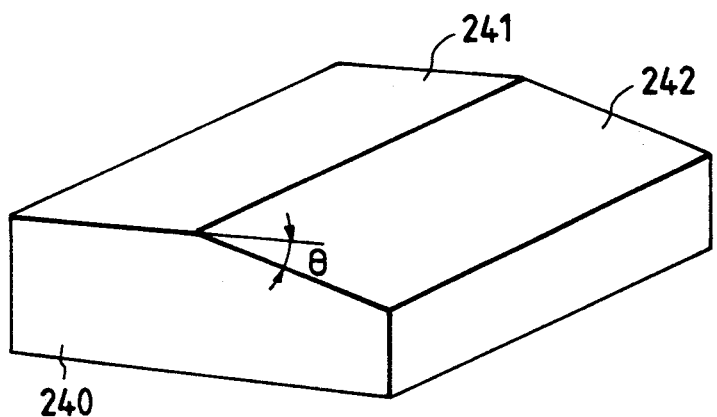
FIGS. 10(a)-10(b) are views showing the manufacturing process of each of Examples 21-22 of the present invention.

Example 21 of the present invention will be described with reference to FIGS. 10(a) and 10(b). First, as shown in FIG. 10(a), the surface of a single-crystal substrate 240 of strontium titanate (SrTiO$_3$) having a plane orientation (100) was cut into a surface part 241 which was exactly conformed to the plane orientation (100) and a surface part 242 which was inclined an angle θ relative to the surface part 241. The respective surface parts were polished into mirror surfaces having no distortion. There were prepared substrate samples whose inclination angles θ were set at 0.5 degree, 1 degree, 2 degrees, 6 degrees, 10 degrees and 14 degrees. Next, while a substrate temperature during film formation was held at 700° C., a layered film 243 was formed on the substrate by vacuum deposition. The layered film 243 consisted of layers of Er$_2$O$_3$, BaO and Cu, which were respectively 60 Å, 185 Å and 60 Å thick in terms of each single layer, and it had a total thickness of 0.7 μm.

Figure 10B:
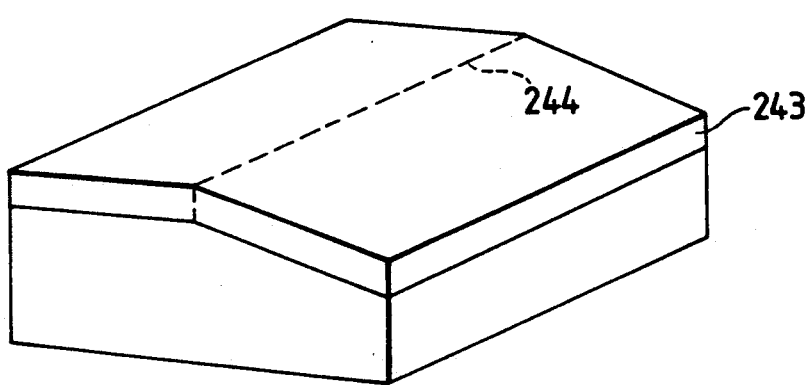

Subsequently, the thin film 243 was annealed in oxygen at 900° C. for 2 hours, thereby to form oxide-superconductor films of Er$_1$Ba$_2$Cu$_3$O$_7$ as shown in FIG. 10(b). Owing to the annealing, the oxide-superconductor film oriented in the a-axis direction of the superconductor was formed on the region 241 exactly conformed to the plane orientation (100). On the other hand, the oxide-superconductor film oriented in the c-axis direction of the superconductor was formed on the region 242 inclined with the angle θ relative to the plane orientation (100). In thin film, a crystal grain boundary 244 was created by the difference of the orientations of the thin film crystals at the boundary part of the substrate 240 at which the crystal plane thereof began to incline.

To examine the superconducting properties of the grain boundary 244, as in Example 1, the parts of the superconducting film 243 at both the ends of the grain boundary 244 were removed to form the neck portion of this superconducting film, and the I-V characteristic of the grain boundary 244 was measured by a conventional four-probe method. As illustrated by a typical example in FIG. 12, the I-V curve exhibited the feature of a superconductivity. A critical current density at 77° K. in the region having no grain boundary was $2 \times 10^5$ A/cm$^2$. As listed in Table 3, critical current densities in the places of the grain boundaries 244 in the samples lowered in a range from 52% to 11% in accordance with the values of the inclination angles $\theta$. When the temperature dependency of the critical current density (Jc) was investigated, a relation of Jc $\propto \{1-(T/TC)\}^{1.5}$ was found. In addition, when the variation of a critical current versus a magnetic field was investigated, the cyclic dependency of the superconducting current upon the magnetic field was observed, and the fabrication of weak-link Josephson junctions was verified.

TABLE 3

| Inclination angle (degree) | Jc/Jco (%) Example 21 | Jc/Jco (%) Example 22 |
|---|---|---|
| 0 | 100 | 100 |
| 0.5 | 52 | 60 |
| 1 | 45 | 55 |
| 2 | 37 | 47 |
| 6 | 28 | 32 |
| 10 | 10 | 23 |
| 14 | 11 | 12 |

EXAMPLE 22

The surface of a single-crystal substrate of magnesium oxide (MgO) having a plane orientation (100) was worked into a shape similar to that of Example 21 as shown in FIG. 10(a), whereupon the respective surface parts of the substrate were polished into mirror surfaces having no distortion. Subsequently, as shown in FIG. 10(b), an oxide-superconductor film of Er$_1$Ba$_2$Cu$_3$O$_7$ having a thickness of 0.3 μm was formed on the substrate by sputtering. The temperature of the substrate during the film formation was set at 700° C. Thereafter, the film was annealed in oxygen at 830° C. for 2 hours. The sample obtained was such that thin films of the oxide superconductor c-axis oriented perpendicularly to the corresponding substrate surface parts were formed on both the region 241 ($\theta=0$ degree) which was exactly conformed to the plane orientation (100) and the region 242 which was inclined at the angle $\theta$ relative to the former region 241, and that a grain boundary was created by the inclination of the orientations of the crystals of the thin films at the boundary part of the substrate at which the crystal plane thereof began to incline. Incidentally, in this example, the film became superconductor during the sputtering, so that the subsequent annealing process was not always necessary.

Figure 12:
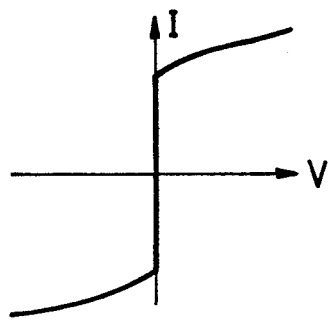
FIG. 12 is a graph showing the I-V characteristic of a grain boundary produced in the present invention.

To examine the superconducting properties of the grain boundary, as in the case of Example 21, both the sides of the grain boundary were removed, and the I-V characteristic of the grain boundary was investigated by a conventional four-probe method. The I-V characteristic exhibited the feature of the superconductivity as illustrated in FIG. 12. A critical current density at 77° K. in the region having no grain boundary was $6 \times 10^4$ A/cm$^2$. As listed in Table 3, critical current densities in the places of the grain boundaries in the samples lowered from 60% to 12%. The reason why the critical current density at the grain boundary was lower as the inclination angle $\theta$ was greater, is as the inclination of the growth axis of the thin film crystal increased, the width of the grain boundary enlarged. When the temperature dependency of the critical current density was investigated, the relation of Jc $\propto \{1-(T/Tc)\}^{1.5}$ was found as to the grain boundaries of the thin films formed using the substrates whose inclination angles were 0.5 degree or above. In addition, the fabrication of weak-link Josephson junctions was verified from the variation of a critical current versus a magnetic field.

EXAMPLE 23

Figure 11:
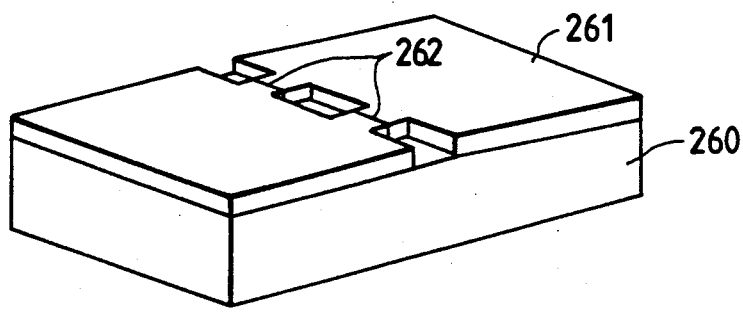
FIG. 11 is a view showing the structure of a SQUID fabricated by Example 23 of the present invention.

A dcSQUID as shown in FIG. 11 was fabricated by utilizing the weak-link Josephson junctions in Examples 21-22 of the present invention. Using a substrate 260 in which a part of the surface of a single-crystal substrate of magnesium oxide (MgO) having a plane orientation (100) was cut at an inclination angle $\theta = 2$ degrees, a thin film of Er$_1$Ba$_2$Cu$_3$O$_7$ 261 having a thickness of 0.3 μm was formed under the same conditions as in Example 22. In the thin film thus formed, a grain boundary 262 was produced at the position of the substrate 260 at which the surface part began to incline. The grain boundary part of the thin film thus formed was processed by photolithography and chemical etching into the pattern of the SQUID which utilized two grain boundaries 262 as shown in FIG. 11.

A magnetic flux was measured at 76° K. by causing a bias current to flow through the SQUID. As a result, a voltage corresponding to a quantum flux was observed as shown in FIG. 13. It has accordingly been indicated that the weak-link junctions which utilize the grain boundaries formed by the present invention are applicable to superconductor devices.

According to Examples 21-23 of the present invention, a single crystal grain boundary can be formed at a predetermined position, and it can therefore be utilized for a superconducting weak-link Josephson junction.

Incidentally, the method of forming a thin film in the present invention has been sputtering or layered deposition. Needless to say, however, the thin film of oxide superconductor can also be formed by reactive evaporation, and other methods of forming a film are applicable.

What is claimed is:

1. A method of forming a weak-link Josephson junction comprising the steps of:
   irradiating a substrate with a substance, thereby processing said substrate so as either to deposit said substance in the form of a line on a surface of said substrate or to damage the surface of said substrate in the form of a line by virtue of said substance, and
   epitaxially growing a thin film of an oxide superconductor on the processed substrate, thereby forming a crystal grain boundary on said line, said crystal grain boundary being used as a weak-link Josephson junction.

2. A method of forming a weak-link Josephson junction as defined in claim 1, wherein said step of irradiating said substrate is performed by a focused ion beam.

3. A method of forming a weak-link Josephson junction as defined in claim 2, wherein said focused ion beam affords a dose within a range of $5 \times 10^{11} - 5 \times 10^{18}$/cm$^2$.

4. A method of forming a weak-link Josephson junction comprising the steps of:
   irradiating a thin film of an oxide superconductor, epitaxially grown on a substrate, with a substance for lowering a critical current density, thereby processing said thin film so as either to diffuse said substance in the form of a line within the thin oxide-superconductor film or to damage the oxide-superconductor thin film in the form of a line by virtue of said substance, and annealing the processed oxide-superconductor film, thereby forming a crystal grain boundary on said line, said crystal grain boundary being utilized as a weak-link Josephson junction.

5. A method of forming a weak-link Josephson junction as defined in claim 4, wherein the irradiation with said substance is performed by a focused ion beam.

6. A method of forming a weak-link Josephson junction as defined in claim 5, wherein said focused ion beam affords a dose within a range of $5 \times 10^{11} - 5 \times 10^{18}/cm^2$.

7. A method of forming a weak-link Josephson junction comprising the steps of:

forming a substrate with sections having different crystal face orientations;

epitaxially growing a thin film of an oxide superconductor on said substrate on which sections different in crystal face orientation are provided, thereby forming a crystal grain boundary between said sections, said crystal grain boundary being used as a weak-link Josephson junction.

8. A method of forming a weak-link Josephson junction device comprising the steps of:

providing a substrate;

irradiating the substrate with a substance so as to form an irradiated region in the substrate; and epitaxially growing an oxide superconductor film on the irradiated region so that the oxide superconducting film has a boundary which has a microcrystal region on the irradiated region.

9. The method as set forth in claim 8 wherein the substrate is a crystal.

10. The method as set forth in claim 9 wherein the irradiated region is a crystalline defect region.

11. The method as set forth in claim 8 wherein the irradiated region is a deposited region.

12. The method as set forth in claim 8 wherein the substance is atoms of different species from the oxide superconducting film.

13. The method as set forth in claim 8 further comprising the step of annealing the oxide superconducting film.

14. The method as set forth in claim 13 wherein said step of annealing is performed in an oxygen atmosphere.

15. The method as set forth in claim 2 wherein the focused ion beam is accelerated by not larger than 30 kV.

16. The method as set forth in claim 1 wherein the substrate comprises gallium.

* * * * *

UNITED STATES PATENT AND TRADEMARK OFFICE
CERTIFICATE OF CORRECTION

PATENT NO. : 5,077,266
DATED : December 31, 1991
INVENTOR(S) : Kazumasa Takagi, et. al.

It is certified that error appears in the above-indentified patent and that said Letters Patent is hereby corrected as shown below:

| Column | Line | |
|---|---|---|
| 1 | 48 | Change "As one" to --One--; after "film" delete ",". |
| 1 | 49 | Delete "there". |
| 1 | 58 | After "method" insert --,-- and delete "wherein". |
| 2 | 35 | Change "form" to --forms--. |
| 3 | 18 | Change "to form" to --forming--. |
| 3 | 24 | After "substrate 130" insert --,--. |
| 5 | 37 | Change "[0011]" to --[001]--. |
| 5 | 48 | Change "700° C." to --700° C--. |
| 5 | 55 | Change "830° C." to --830° C--. |
| 5 | 67 | Change "77° K." to --77° K--. |
| 6 | 37 | Change "830° C." to --830° C--. |
| 6 | 43 | Change "88° K." to --88° K--. |
| 6 | 47 | Change "77° K." to --77° K--. |
| 7 | 5 | Change "77° K." to --77° K--. |
| 7 | 18 | Change "77° K." to --77° K--. |
| 8 | 48 | Change "76° K." to --76° K--. |
| 8 | 64 | Change "700° C." to --700° C--. |
| 9 | 8 | Change "830° C." to --830° C--. |

UNITED STATES PATENT AND TRADEMARK OFFICE
CERTIFICATE OF CORRECTION

Page 2 of 3

PATENT NO. : 5,077,266
DATED : December 31, 1991
INVENTOR(S) : Kazumasa Takagi, et. al.

It is certified that error appears in the above-indentified patent and that said Letters Patent is hereby corrected as shown below:

| Column | Line | |
|---|---|---|
| 9 | 24 | Change "77° K." to --77° K--. |
| 9 | 54 | Change "830° C." to --830° C--. |
| 9 | 65 | Change "88° K." to --88° K--. |
| 10 | 1 | Change "77° K." to --77° K--. |
| 10 | 26 | Change "77° K." to --77° K--. |
| 10 | 39 | Change "77° K." to --77° K--. |
| 12 | 7 | Change "76° K." to --76° K--. |
| 12 | 42 | Change "700° C." to --700° C--. |
| 12 | 48 | Change "900° C." to --900° C--. |
| 13 | 3 | Change "K." to --K--. |
| 13 | 38 | Change "830° C." to --830° C--. |
| 13 | 59 | Change "K." to --K--. |
| 13 | 64 | After "is" insert --that--. |
| 14 | 24 | Change "76° K." to --76° K--. |

UNITED STATES PATENT AND TRADEMARK OFFICE
CERTIFICATE OF CORRECTION

PATENT NO. : 5,077,266
DATED : December 31, 1991
INVENTOR(S) : Kazumasa Takagi, et. al.

It is certified that error appears in the above-indentified patent and that said Letters Patent is hereby corrected as shown below:

Column 14, line 24, change "76° K." to --76° K--.

Signed and Sealed this

Tenth Day of August, 1993

Attest:

MICHAEL K. KIRK

Attesting Officer

Acting Commissioner of Patents and Trademarks